United States Patent
Adachi et al.

(10) Patent No.: US 6,645,645 B1
(45) Date of Patent: Nov. 11, 2003

(54) PHOSPHORESCENT ORGANIC LIGHT EMITTING DEVICES

(75) Inventors: Chihaya Adachi, East Windsor, NJ (US); Marc A. Baldo, Princeton, NJ (US); Stephen R. Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 160 days.

(21) Appl. No.: 09/629,335

(22) Filed: Aug. 1, 2000

Related U.S. Application Data

(60) Provisional application No. 60/207,330, filed on May 30, 2000.

(51) Int. Cl.⁷ ............................................. H05B 33/14
(52) U.S. Cl. ...................... 428/690; 428/917; 313/504; 313/506; 257/102; 257/103
(58) Field of Search ........................ 428/690, 917, 428/212, 704; 313/504, 506; 257/102, 103; 427/66

(56) References Cited

U.S. PATENT DOCUMENTS

| | | | | |
|---|---|---|---|---|
| 5,281,489 A | * | 1/1994 | Mori et al. | 428/690 |
| 5,294,810 A | | 3/1994 | Egusa et al. | 257/40 |
| 5,703,436 A | | 12/1997 | Forrest et al. | 313/506 |
| 5,707,745 A | | 1/1998 | Forrest et al. | 428/432 |
| 6,013,538 A | | 1/2000 | Burrows et al. | 438/22 |
| 6,242,115 B1 | * | 6/2001 | Thomson et al. | 428/690 |
| 6,303,238 B1 | * | 10/2001 | Thompson et al. | 428/690 |
| 2002/0146589 A1 | | 10/2002 | Akiyama et al. | |

OTHER PUBLICATIONS

I.G. Hill et al., "Determination of the energy levels of a phosphorescent guest in organic light emitting devices", Applied Physics Letters, vol. 77, No. 13, pp. 2003–2005 (Sep. 25, 2000).*

S.L. Murov et al., "Handbook of Photochemistry", 2ⁿᵈ Edition, Marcel Dekker, Inc., New York, 1993, pp. 1–3 and 54–55. (no month).

Y. Kunugi, et al., "A Vapochromic LED", *J. Am. Chem. Soc.*, vol. 120, No. 3, pp. 589–590, 1998. (no month).

C.W. Tang, et al., "Organic Electroluminescent Diodes", 51 *Appl. Phys. Lett.*, pp. 913–915 (Sep. 1987).

S.R. Forrest, et al., "Organic Emitters Promise a New Generation of Displays", *Laser Focus World*, (Feb. 1995), pp. 99–107.

Baldo, et al., "Very high efficiency green organic light–emitting devices based on electrophosphorescence", 75 *Applied Physics Letters*, 4–6, (Jul. 1999).

C.H. Chen, et al., "Recent developments in molecular organic electroluminescent materials", *Macromolecular Symposia*, 125, 1–48 (1997). (no month).

M.A. Baldo, et al., "Highly efficient phosphorescent emission from organic electroluminescent devices", *Nature*, vol. 395, 151–154, (Sep. 1998).

D.L. Dexter, "A Theory of Sensitized Luminescence in Solids", *J. Chem. Phys.*, 21, pp. 838–850, Jan.–Dec. 1953.

Takada et al., "Strongly Directed Emission from Controlled–Spontaneous–Emission Electroluminescent Diodes with Europium Complex as an Emitter", *Japanese J. Appl. Phys.*, L863 (Jun. 15, 1994), pp. L863–L866.

Charles, et al., "Infrared Absorption spectra of metal chelates derived from . . . ", *Spectrochimica Acta*, v. 8 (1956), pp. 1–8. (no month).

Chen et al., "Metal chelates as emitting materials for organic electroluminescence", *Coord. Chem. Rev.*, v. 171 (May 1998), pp. 161–174.

Dirr et al., "Vacuum–deposited thin films of lanthanide complexes: Spectral properties and application in organic light emitting diodes", *SID 97 Digest*, First Edition (May 1997), pp. 778–781.

Kido et al., "Organic electroluminescent devices using lanthanide complexes", *Journal of Alloys and Compounds*, vol. 192 (1993), pp. 30–33. (no month).

Kido, et al., "White–light–emitting organic electroluminescent device using lanthanide complexes", *Jpn. J. Appl. Phys.*, V. 35, pp. L394–L396, Mar. 1996.

M. Klesinger, et al., *Excited States and Photochemistry of Organic Molecules*, VCH Publishers, Inc., 1995, pp. 260–271 and 295–297. (no month).

* cited by examiner

*Primary Examiner*—Marie Yamnitzky
(74) *Attorney, Agent, or Firm*—Kenyon & Kenyon

(57) ABSTRACT

An organic light emitting device structure having an organic light emitting device (OLED) over a substrate, where the OLED has, for example, an anode, a hole transporting layer (HTL), a first electron transporting layer (ETL) that is doped with a phosphorescent material, a second electron transporting layer (ETL), and a cathode. The OLEDs of the present invention are directed, in particular, to devices that include an emissive layer comprised of an electron transporting host material having a triplet excited state energy level that is higher than the emissive triplet excited state energy level of the phosphorescent dopant material.

22 Claims, 10 Drawing Sheets

PHOSPHORESCENT ORGANIC LIGHT EMITTING DEVICES

The present application claims the benefit under 35 U.S.C. 119(e) of provisional application 60/207,330, filed May 30, 2000.

FIELD OF THE INVENTION

The present invention provides high efficiency phosphorescent organic light emitting devices. The present invention relates, for example, to an organic light emitting device (OLED) over a substrate, where the OLED has an anode, a hole transporting layer (HTL), a first electron transporting layer (ETL) that is doped with a phosphorescent material, a second electron transporting layer (ETL), and a cathode. Specific embodiments of the present invention include use of an aryl-substituted oxadiazole, an aryl-substituted triazole, an aryl-substituted phenanthroline, a benzoxazole or benzthiazole compound as the first ETL that is used as the host for the emissive phosphorescent dopant material. Another embodiment comprises a second ETL that functions as a hole blocking layer between the phosphorescent doped ETL and the cathode.

BACKGROUND OF THE INVENTION

Organic light emitting devices (OLEDs) include several organic layers in which at least one of the layers includes an organic material that can be made to electroluminesce by applying a voltage across the device, C. W. Tang et al., Appl. Phys. Lett. 1987, 51, 913. Certain OLEDs have been shown to have sufficient brightness, range of color and operating lifetimes for use as a practical alternative technology to LCD-based full color flat-panel displays (S. R. Forrest, P. E. Burrows and M. E. Thompson, Laser Focus World, February 1995). Since many of the thin organic films used in such devices are transparent in the visible spectral region, they allow for the realization of a completely new type of display pixel in which red (R), green (G), and blue (B) emitting OLEDs are placed in a vertically stacked geometry to provide a simple fabrication process, a small R-G-B pixel size, and a large fill factor, U.S. Pat. No. 5,707,745.

A transparent OLED (TOLED), which represents a significant step toward realizing high resolution, independently addressable stacked R-G-B pixels, was disclosed in U.S. Pat. No. 5,703,436, in which the TOLED had greater than 71% transparency when turned off and emitted light from both top and bottom device surfaces with high efficiency (approaching 1% quantum efficiency) when the device was turned on. The TOLED used transparent indium tin oxide (ITO) as the hole-injecting electrode and a Mg—Ag-ITO electrode layer for electron-injection. A device was disclosed in which the ITO side of the Mg—Ag-ITO layer was used as a hole-injecting contact for a second, different color-emitting OLED stacked on top of the TOLED. Each layer in the stacked OLED (SOLED) was independently addressable and emitted its own characteristic color. This colored emission could be transmitted through the adjacently stacked, transparent, independently addressable, organic layer or layers, the transparent contacts and the glass substrate, thus allowing the device to emit any color that could be produced by varying the relative output of the red and blue color-emitting layers.

U.S. Pat. No. 5,707,745 disclosed an integrated SOLED for which both intensity and color could be independently varied and controlled with external power supplies in a color tunable display device. U.S. Pat. No. 5,707,745, thus, illustrates a principle for achieving integrated, full color pixels that provide high image resolution, which is made possible by the compact pixel size. Furthermore, relatively low cost fabrication techniques, as compared with prior art methods, may be utilized for making such devices. Until recently, it was not believed that organic materials could be used to produce efficient room temperature electrophosphorescence. In contrast, use of fluorescent dyes in OLEDs has been known for much longer, (C. H. Chen, J. Shi, and C. W. Tang, "Recent developments in molecular organic electroluminescent materials," Macromolecular Symposia, 1997, 125, 1–48; U. Brackmann, Lambdachrome Laser Dyes (Lambda Physik, Gottingen, 1997, and references cited therein) and fluorescent efficiencies in solution approaching 100% are not uncommon. (C. H. Chen, 1997, op. cit.) Fluorescence is also not affected by triplet-triplet annihilation, which degrades phosphorescent emission at high excitation densities. (M. A. Baldo, et al., "High efficiency phosphorescent emission from organic electroluminescent devices," Nature, 1998, 395, 151–154). Consequently, fluorescent materials are suited to many electroluminescent applications, particularly passive matrix displays.

An advantage of phosphorescence is that all excitons (formed by the recombination of holes and electrons in an ETL), which are in fact predominantly triplets in an OLED, may participate in energy transfer and luminescence in certain electroluminescent materials. In contrast, only a small percentage of excitons in fluorescent emitting devices, which are singlet-based, result in fluorescent luminescence. Fluorescence is, thus, at best only one-third as efficient as phosphorescence due to the formation of three times more triplet excitons than singlet excitons. Recently it was discovered that very high efficiency organic light emitting devices could be fabricated based on electrophosphorescence (M. A. Baldo, D. F. O'Brien, M. E. Thompson and S. R. Forrest, Very high-efficiency green organic light-emitting devices based on electrophosphorescence, Applied Physics Letters, 1999, 75, 4–6.) The terms fluorescence and phosphorescence refer to the type of radiative emission, respectively, that is typically understood by one skilled in the art. That is, fluorescence refers to radiative emission from an excited singlet state and phosphorescence refers to radiative emission from an excited triplet state.

In view of the improved external efficiency that can be realized for electrophosphorescent OLEDs, it would be desirable to find additional materials as host materials for emissive phosphorescent dopant materials so that even higher external efficiencies can be produced.

SUMMARY OF THE INVENTION

The OLEDs of the present invention typically have an anode, an HTL, a first ETL that is doped with a phosphorescent material, a second ETL, and a cathode. The OLED may be formed over the substrate with either the anode side closest to a substrate or the cathode side closest to the substrate. When the cathode side is closest to the substrate the OLED is considered to be inverted. In each embodiment, the first ETL, which is doped with the phosphorescent material, is positioned between an HTL and the second ETL.

The present invention also encompasses stacked OLED structures, in which at least one OLED or inverted OLED has a doped first ETL between an HTL and a second ETL. When more than one OLED is stacked over the substrate, the OLEDs are stacked one upon the other.

The present invention is directed, in particular, to an ETL host material comprised of an aryl-substituted oxadiazole, an aryl-substituted triazole, an aryl-substituted phenanthroline, a benzoxazole or benxthiazole compound. As a representative embodiment of the present invention, the emissive phosphorescent dopant material may be fac-tris (2-phenylpyridine) iridium (Ir(ppy)$_3$), having the chemical formula:

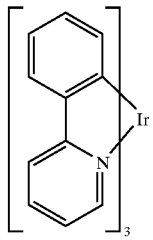

More specifically, the phosphorescent-host material may be comprised of an aryl-substituted oxadiazole, such as represented by the chemical formula:

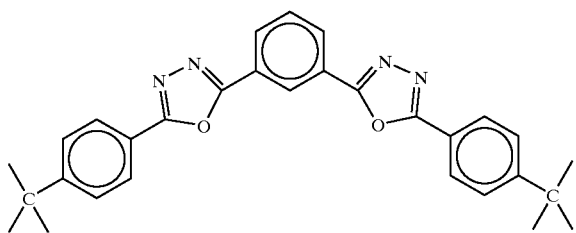

As yet another embodiment of the present invention, the phosphorescent-host material may be comprised of an aryl-substituted triazole, for example, such as 3-phenyl-4-(1-naphthyl)-5-phenyl-1,2,4-triazole (TAZ) as represented by the following chemical formula:

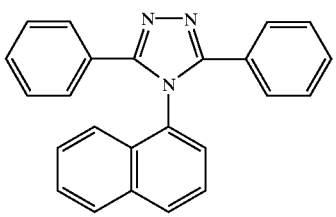

As yet still another embodiment of the present invention, the phosphorescent-host material may be comprised of an aryl-substituted phenanthroline, for example, such as 2,9-dimethyl-4,7-diphenyl-phenanthroline (BCP), as represented by the following chemical formula:

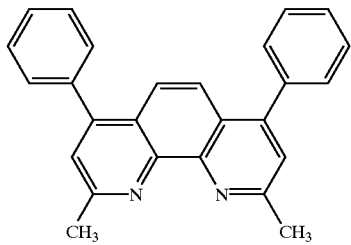

Without intending to be limited to the theory of how the high efficiencies of the devices of the present invention works, it is believed that the high efficiencies that are achieved for the representative embodiments of the present invention, Ir(ppy)$_3$ in OXD-7, TAZ, BCP, or a zinc benzoxazole compound are due to the fact that the host matrix comprises a host material having a triplet state energy sufficiently higher than the triplet state energy of the emissive phosphorescent dopant that very little, if any energy transfer of the triplet energy from the emissive dopant to the host material occurs. Such energy transfer of the triplet excitation energy from the emissive dopant to the host material can result in significant non-radiative energy losses.

While the rate and extent of energy transfer from the triplet dopant to the triplet may depend on many factors, including, for example, the relative radiative lifetimes of the respective triplet states, it is believed than an energy difference of at least about 0.1 eV between the triplet host and triplet dopant is sufficient to prevent significant non-radiative energy losses to the host.

As representative embodiments of the present invention, the host matrix may be comprised of an aryl-substituted oxadiazole, an aryl-substituted triazole, an aryl-substituted phenanthroline, a benzoxazole or a benzthiazole compound that has a lowest triplet state with an energy greater than the emissive dopant triplet energy.

As still another aspect of the present invention, it is believed that the improved external efficiency of the devices of the present invention may also be due, in part, to the improved recombination efficiency of holes and electrons in phosphorescent dopant materials that is provided by charge-carrier-trapping of holes. A phosphorescent dopant material that is capable of trapping holes is one for which the HOMO energy of the phosphorescent dopant molecules is less than the ionization potential of the host molecules. Thus, the present invention is further directed to phosphorescent-doped hosts wherein the phosphorescent molecules are capable of improving the hole/electron recombination efficiency by functioning as charge carrier trapping sites, in particular, charge carrier trapping sites for trapping holes.

The OLEDs of the present invention are directed, in particular, to devices that include an emissive layer comprised of a host material having a lowest triplet state having an energy level that is larger than the triplet state energy level of the phosphorescent dopant material.

The present invention is further directed to a phosphorescent dopant material comprised of molecules having charge carrier trapping sites. As a representative embodiment of the present invention, the emissive layer may be comprised of a host electron transporting material and a phosphorescent dopant material that traps holes in the highest occupied molecular orbitals (HOMO) of the phosphorescent dopant molecule. Such phosphorescent dopant-materials have a HOMO energy that is less than the ionization potential of the host electron transporting level. In addition, such phosphorescent dopant molecules have a lowest unoccupied molecular orbital (LUMO) energy level that is lower than the LUMO energy level of the host material.

While the present invention has been illustrated herein for OLEDs having a heterojunction, it is to be understood that the materials and methods described herein may also be used in OLEDs that do not contain a heterojunction. Such heterojunction-free OLEDs are sometimes referred to as single layer devices.

While the preferred embodiments of the present invention have been described as having a second ETL, which is present between the phosphorescent-doped first ETL, and the cathode, the present invention is also directed to a phosphorescent-doped host ETL that is in direct contact with the cathode. In this embodiment of the invention, the host ETL is still required to have a triplet excited state that is of higher energy than the emissive triplet excited state of the phosphorescent dopant, such that there are no significant non-radiative losses via energy transfer through the triplet excited state of the host.

In yet another embodiment of the invention, the host ETL is still required to have a triplet excited state that is of higher energy than the emissive triplet state of the phosphorescent dopant. However, rather than requiring the HOMO levels of the phosphorescent dopant molecules to function as hole trapping sites, a second ETL is present that functions as a hole blocking layer between the phosphorescent doped ETL and the cathode.

A hole blocking layer (HBL) comprises a material, typically an electron transporting material, that is effective in blocking transport of holes through the HBL. Such transport of holes can lead to significant loss of device efficiency due to the undesired recombination of holes and electrons at the cathode surface. An effective hole blocking material is one for which the ionization potential of the material is at least slightly larger than the ionization potential of the adjacent emissive layer. For example, specifically, the hole blocking material has an ionization potential at least about 0.1 eV larger than the ionization potential of the adjacent emissive layer. Such materials of the hole blocking layer also preferably have high electron transporting properties, such as a high electron mobility.

Thus, in these representative embodiments of the present invention, the invention may be characterized as relating to OLEDs that simply include a phosphorescent-doped host ETL in which the host ETL has a triplet excited state that is of higher energy than the emissive triplet state of the phosphorescent dopant.

It is to be understood that, while the host ETL may typically have more than one triplet excited state, each triplet excited state is required to be of higher energy than the emissive triplet excited state of the phosphorescent dopant. Thus, reference herein to the triplet excited state of the host ETL that is required to have a higher energy level than the energy level of the emissive triplet excited state refers to the lowest triplet excited state of the host ETL, if there is more than one triplet excited state in the host ETL.

Further objectives and advantages of the present invention will be apparent to those skilled in the art from the detailed description of the disclosed invention.

BRIEF DESCRIPTION OF THE DRAWINGS

FIG. 5 inset shows the energy level diagram of the materials in the devices used for measuring the external quantum efficiency as a function of the EML thickness.

DETAILED DESCRIPTION OF THE INVENTION

Figure 1:
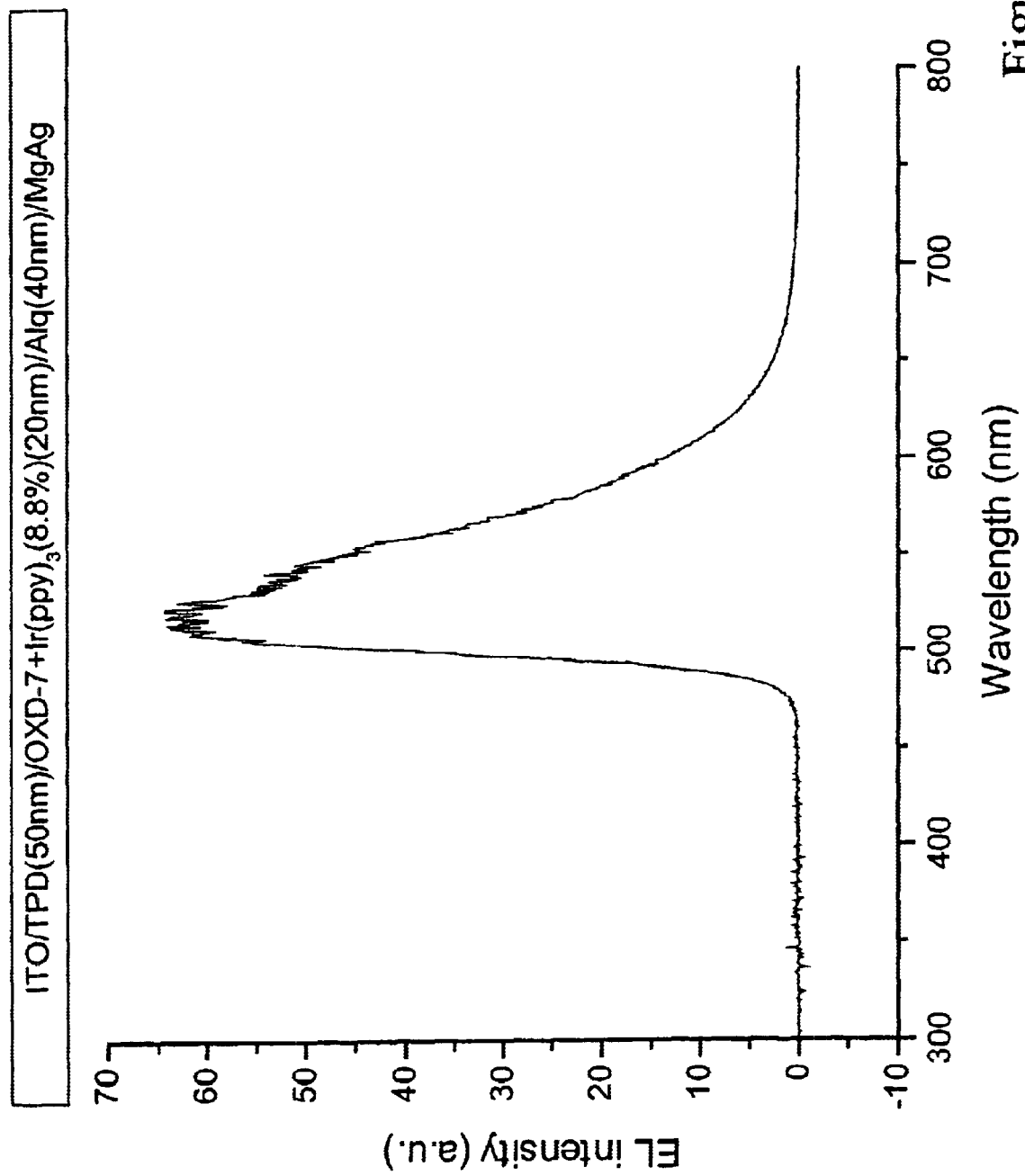
FIG. 1 is a graph showing the electroluminescent (EL) intensity as a function of wavelength for $Ir(ppy)_3$ doped in an oxadiazole (OXD-7) host material.

The present invention will be described with reference to the illustrative embodiments in the following description. These embodiments are intended only as illustrative examples and the invention is not to be limited thereto.

The present invention relates to an organic light emitting device (OLED) structure having an OLED over a substrate. The OLED has an anode, an HTL, a first ETL that is doped with a phosphorescent material, a second ETL, and a cathode. In each embodiment of the invention, the OLED includes a first electron transporting layer having a phosphorescent material doped therein. In one of the representative embodiments of the invention, an emissive layer (EML) comprised of an electron transporting material is present between a hole transporting layer and a second electron transporting layer. As would be understood by one skilled in the art, a hole transporting material is one in which charge carrier transport is predominantly by the transport of holes and an electron transporting material is one for which charge carrier transport is predominantly by the transport of electrons.

In another embodiment, the OLED structure includes a substrate, an anode over the substrate, a hole transporting layer over the anode, an electron transporting layer over the hole transporting layer and a cathode over the electron transporting layer. The electron transporting layer is doped with a phosphorescent material.

In another embodiment of the present invention, the OLED structure includes an inverted OLED over a substrate. In this embodiment, a cathode is positioned over the substrate, a second electron transporting layer over the cathode, a first electron transporting layer over the second electron transporting layer, a hole transporting layer over the first electron transporting layer and a cathode over the hole transporting layer. The first electron transporting layer is doped with a phosphorescent material. Alternatively, in still another embodiment, an inverted OLED may comprise a single electron transporting layer doped with a phosphorescent material.

The present invention is directed, in representative embodiments of the present invention, to an OLED that includes a host ETL doped with a phosphorescent material, wherein the host layer is comprised of an aryl-substituted oxadiazole, an aryl-substituted triazole, an aryl-substituted phenanthroline, a benzoxazole or a benzthiazole compound that has a triplet state energy level that is higher than the triplet state energy level of the emissive phosphorescent dopant. More specifically, the oxadiazole, triazole, phenanthroline, benzoxazole or benxthiazole compound has a triplet state energy level that is sufficiently higher than the emissive triplet state energy level of the phosphorescent dopant material that little, if any, of the dopant triplet excitation energy is transferred and non-radiatively lost to and through the host triplet state.

The present invention is directed, furthermore, to an OLED that includes a phosphorescent material comprised of molecules capable of functioning as charge carrier trapping sites. More specifically, the HOMO levels of the phosphorescent molecules are capable of trapping holes, such that the electron/hole recombination efficiency may be increased as compared with devices having phosphorescent molecules that do not function as charge carrier trapping sites.

The aryl-substituted oxadiazole that functions as the electron transporting host layer may be selected from compounds having the chemical formula:

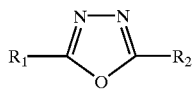

where $R_1$ and $R_2$ are, independently of one another, aryl-containing substituents that may also include additional oxadiazole units, as represented by the chemical structure

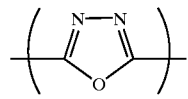

Specific representative embodiments of the oxadiazole compounds include:

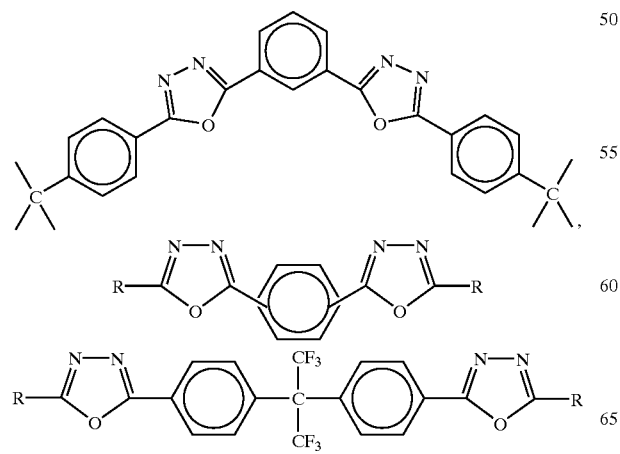

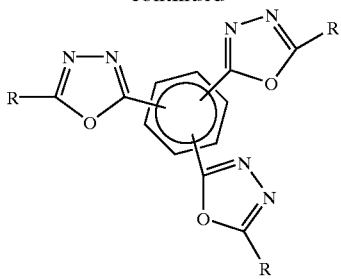

The aryl-substituted 1,2,4-triazoles that function as the electron transporting host layer may be selected from compounds having the chemical formula:

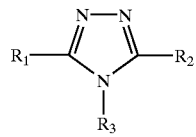

where $R_1$, $R_2$ and $R_3$, independently of one another, may be hydrogen, an alkyl, or are aryl-containing substituent wherein at least one substituent includes at least one aryl-group, preferably, more than one aryl-group-containing substituent is present. A specific representative example of a 1,2,4-triazole of the present invention is 3-phenyl-4-(1-naphthyl)-5-phenyl-1,2,4-triazole (TAZ) having the following chemical formula:

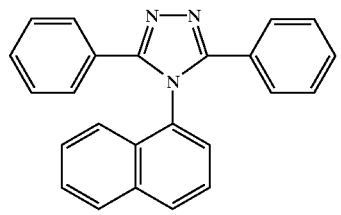

The aryl-substituted phenanthrolines that may function as the electron transporting host layer of the present invention may be selected from compounds having the chemical formula:

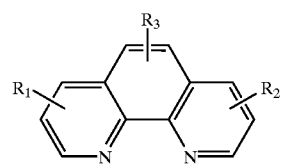

where $R_1$, $R_2$, $R_3$, independently of one another, may represent one or more alkyl or aryl-containing substituents, and at least one R-group is an aryl-containing substituent. Preferably, more than one aryl-containing substituent is present. A specific representative example of an aryl-substituted phenanthroline that may function as the electron transporting host layer is 2, 9-dimethyl-4,7-diphenyl-phenanthroline (BCP or bathocuproine), as represented by the formula:

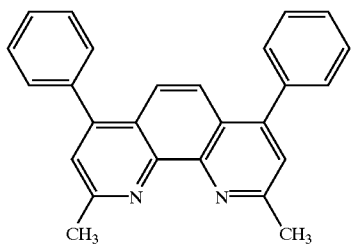

Also included within the scope of the present invention are benzoxazole host compounds having the chemical formula (herein referred to as "metal(BOX)" compounds):

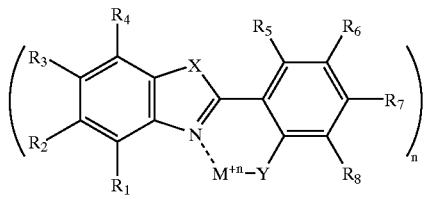

where X and Y are independently O, S;
M represents a metal;
is a integer from 1 to 3; and $R_1$ to $R_8$ are, independently, a hydrogen atom, an aryl group or an alkyl group.

As used herein, the term "BOX" is used to encompass any benzoxazole compound or derivative as depicted above. Alkyl groups of length one to four carbons are preferred alkyl chain lengths.

Preferred embodiments are have a chemical formula within the following class of compounds:

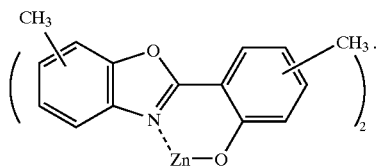

In this representation, the line segments to the $CH_3$- (methyl-) group denote substitution at any allowed ring position by each methyl independently. Specific preferred embodiments are compounds having the following chemical structures ($Zn(BOX\text{-}DMe)_2$):

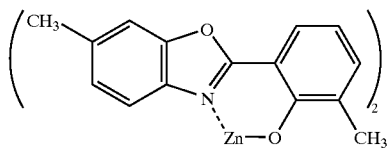

and

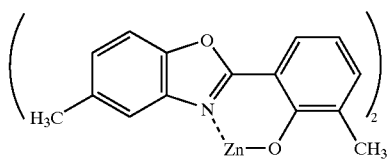

These are methyl-substituted bis(2-(2-hydroxyphenyl)-benzoxazolate)zinc derivatives.

Preferred embodiments are also within the following class:

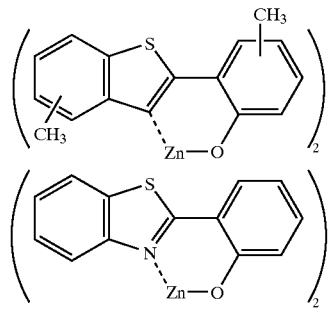

These are methyl-substituted as well as un-substituted bis(2-(2-hydroxyphenyl)-benzthiazolate)zinc derivatives.

These benzoxazole and benzthiazole host compounds are exemplified for the metal Zn. Useful results may also be expected for phosphorescent-doped Os, Ir, and Pt host benzoxazole and benzthiazole host compounds and analogous derivatives for which the excited triplet state of the host benzoxazole compound is of higher energy than the emissive triplet state of the phosphorescent dopant material.

The use of a first electron transporting layer that is doped with a electrophosphorescent material can improve the electrophosphorescent efficiency as compared with devices in which the electrophosphorescent material is doped in a hole transporting material. Since the electrophosphorescent emission occurs in the emissive layer (EML) within close proximity to the HTL/EML interface, the EML layer is preferably a very thin layer as compared with the HTL or second ETL. For example, the EML preferably has a thickness of about 2.5 nm to about 30 nm whereas the HTL and ETL typically have a thickness of about 5 nm to about 60 nm. More preferably, the EML has a thickness of about 5 nm to about 25 nm.

The first electron transporting layer, which is the emissive layer (EML), may include any suitable host material that acts as a good transporter of charge and also efficiently transfers energy to a highly luminescent guest. In the preferred embodiments, the first electron transporting layer is a host material of 3-phenyl-4-(1'-naphthyl)-5-phenyl-1,2,4-triazole (TAZ), an oxadiazole or an oxadiazole derivative such as OXD-7, as depicted herein, or a phenanthroline such as 2,9-dimethyl-4,7-diphenyl-1,10-phenanthroline (bathocuproine or BCP) a BCP derivative, or a substituted or un-substituted benzoxazole or benzthiazole compound. These thin films possess good electron transport characteristics while also serving to block hole and exciton transport. BCP has the following formula:

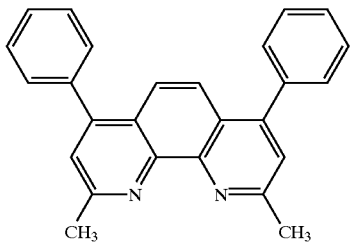

The first electron transporting layer, preferably TAZ, OXD-7, BCP or a benzoxazole or benzthiazole compound may function as an electron transport layer and/or as an exciton blocking layer. The exciton blocking layer in OLED devices substantially blocks the diffusion of excitons, thus substantially keeping the excitons within the first ETL to enhance device efficiency. The phosphorescent dopants of the present invention are believed to trap excitons within the luminescent region, thus improving the efficiency of devices of the present invention over other devices. In particular, using TAZ as the host and Ir(ppy)$_3$ as the dopant, a maximum external quantum efficiency of 15.4% and power luminous efficiency of 40 lm/W may be achieved. The electroluminescent spectra due to an Ir(ppy)$_3$ triplet are independent of ETL host thickness. Thus, it is believed that the electroluminescence may be due to trapping of charge carriers and efficient formation of radiative triplet excitons on the Ir(ppy)$_3$ dopant. The charge carriers and triplet excitons are believed to be confined within the very thin EML.

A material that is used as the exciton blocking layer in an OLED may be defined as a material that has an exciton energy, defined as the energy difference between the electron and hole in a ground state exciton, that is greater than the energy of the excitons that are produced in the emissive layer of the OLED. Because of the coulomb forces between the nearby electron and hole in a ground state exciton, the exciton energy of an organic material is typically slightly less than the energy difference between the lowest unoccupied molecular orbital (LUMO) and the highest occupied molecular orbital (HOMO) of the material. Such an exciton energy substantially prevents the diffusion of excitons through the blocking layer, yet has only a minimal effect on the turn-on voltage of a completed electroluminescent device.

Phosphorescent emitters having satisfactory characteristics, such as stability, luminance, weather resistance and afterglow, may be used as phosphorescent dopants in the present invention. Specific examples of phosphorescent molecules include organometallic complexes of metal species M with a bidentate mono-anionic ligand in which M is coordinated with an sp$^2$ hybridized carbon and a heteroatom of the ligand. The complex may be of the form L$_3$M (wherein each ligand L species is the same), L L' L" M (wherein each ligand species L, L', L" is distinct), or L$_2$MX, wherein X is a monoanionic bidentate ligand. It is generally expected that the ligand L participates more in the emission process than does X. Preferably, M is a third row transition metal and most preferably M is Ir or Pt. Such molecules also include meridianal isomers of L$_3$M wherein the heteroatoms (such as nitrogen) of two ligands L are in a trans configuration. In an embodiment in which M is coordinated with an sp$^2$ hybridized carbon and a heteroatom of the ligand, it is preferred that the ring comprising the metal M, the sp$^2$ hybridized carbon and the heteroatom contain 5 or 6 atoms.

In phosphorescent molecules having the formula L$_2$MX, L and X are distinct bidentate ligands and M is a metal of atomic number greater than 40 which forms octahedral complexes and is preferably a member of the third row (of the transition series of the periodic table) transition metals, preferably iridium (Ir). A preferred embodiment is a compound of formula L$_2$IrX, wherein L and X are distinct bidentate ligands, as a dopant in a host electron transporting layer in an organic light emitting device. Alternatively, M can be a member of the second row transition metals, or of the main group metals, such as Zr and Sb. Some of such organometallic complexes electroluminesce, with emission coming from the lowest energy ligand or metal ligand charge transfer ("MLCT") state. L coordinates to M via atoms of L comprising sp$^2$ hybridized carbon and heteroatoms.

The above phosphorescent emitter molecules having the formula L$_2$MX can be made by the direct reaction of chloride bridged dimers of the form L$_2$M($\mu$-Cl)$_2$ML$_2$, wherein L a bidentate ligand, and M a metal such as Ir, with species XH which serve to introduce a bidentate ligand X. XH can be, for example, acetylacetone, 2-picolinic acid, or N-methylsalicyclanilide, and H stands for hydrogen. The resultant product is of formula L$_2$MX, wherein one can have an octahedral disposition of the bidentate ligands L, L, and X about M.

The resultant compounds of formula L$_2$MX can be used as phosphorescent emitters in organic light emitting devices. For example, compounds having the formula L$_2$MX, wherein L=(2-phenylbenzothiazole), X=acetylacetonate, and M=Ir (the compound abbreviated as BTIr) may be used phosphorescent emitters when used as a dopant.

The synthetic process to make L$_2$MX may be used advantageously in a situation in which L, by itself, is fluorescent, but the resultant L$_2$MX is phosphorescent. One specific example of this is where L=coumarin-6. L$_2$IrX has been prepared wherein L=coumarin and X=acac. This compound is referred to as coumarin-6["C6Ir"]. The complex gives intense orange emission, whereas coumarin by itself emits green.

If the L ligand that is used in making the L$_2$MX (for example, M=Ir) complex has a high fluorescent quantum efficiency, it is possible to use the strong spin orbit coupling of the Ir metal to efficiently intersystem cross in and out of the triplet states of the ligands. Ir makes the L ligand an efficient phosphorescent center. Using this approach, it is possible to take substantially any fluorescent dye and make an efficient phosphorescent molecule from it (that is, L is fluorescent but L$_2$MX (M=Ir) phosphorescent).

The appropriate selection of L and X allows color tuning of the complex L$_2$MX relative to L$_3$M. For example, Ir(ppy)$_3$ and (ppy)$_2$Ir(acac) both give strong green emission with a $\lambda_{max}$ of510 nm [ppy denotes phenyl pyridine]. However, if the X ligand is formed from picolinic acid instead of from acetylacetone, there is a small blue shift of about 15 nm.

Non-limiting examples of L are 2-(1-naphthyl) benzoxazole), (2-phenylbenzoxazole), (2-phenylbenzothiazole), (2-phenylbenzothiazole), (7,8-benzoquinoline), coumarin, (thienylpyridine), phenylpyridine, benzothienylpyridine, 3-methoxy-2-phenylpyridine, thienylpyridine, and tolylpyridine.

Non-limiting examples of X are acetylacetonate ("acac"), hexafluoroacetylacetonate, salicylidene, picolinate, and 8-hydroxyquinolinate.

Further examples of L and X may be found in Comprehensive Coordination Chemistry, Volume 2, G. Wilkinson (editor-in-chief), Pergamon Press, especially in chapter 20.1 (beginning at page 715) by M. Calligaris and L. Randaccio and in chapter 20.4 (beginning at page 793) by R. S. Vagg.

Furthermore, X can be selected such that it has a certain HOMO level relative to the L$_3$M complex so that carriers (holes or electrons) might be trapped on X (or on L) without a deterioration of emission quality. In this way, carriers (holes or electrons) which might otherwise contribute to deleterious oxidation or reduction of the phosphor would be impeded. The carrier that is remotely trapped could readily recombine with the opposite carrier either intramolecularly or with the carrier from an adjacent molecule.

Other phosphorescent emitter molecules that may be used have the formula L L' L" M, D wherein L, L', and L" are the same or different, wherein L, L40, and L" are bidentate, monoanionic ligands, wherein M is a metal which forms octahedral complexes, preferably a member of the third row of transition metals, more preferably Ir or Pt, and wherein the coordinating atoms of the ligands comprise $sp^2$ hybridized carbon and a heteroatom. Certain phosphorescent compounds have been studied wherein M=iridium. The resultant iridium complexes emit strongly, in most cases with lifetimes of 1–3 microseconds ("$\mu$sec"). Such a lifetime is indicative of phosphorescence. The radiative transition in these materials is from a metal ligand charge transfer complex (MLCT).

To understand the specific phosphorescent molecules described herein it is useful to discuss the underlying mechanistic theory of energy transfer. There are two mechanisms commonly discussed for the transfer of energy to an acceptor molecule. In the first mechanism of Dexter transport (D. L. Dexter, "A theory of sensitized luminescence in solids," J. Chem.

Phys., 1953, 21, 836–850), the exciton may hop directly from one molecule to the next. This is a short-range process dependent on the overlap of molecular orbitals of neighboring molecules. It also preserves the symmetry of the donor and acceptor pair (E. Wigner and E. W. Wittmer, Uber die Struktur der zweiatomigen Molekelspektren nach der Quantenmechanik, Zeitschrift fur Physik, 1928, 51, 859–886; M. Klessinger and J. Michl, Excited states and photochemistry of organic molecules (VCH Publishers, New York, 1995). Thus, the energy transfer of Eq. (1) is not possible via Dexter mechanism. In the second mechanism of Forster transfer (T. Förster, Zwischenmolekulare Energiewanderung and Fluoreszenz, Annalen der Physik, 1948, 2, 55–75; T. Förster, Fluoreszenz organischer Verbindugen (Vandenhoek and Ruprecht, Gottinghen, 1951), the energy transfer of Eq. (1) is possible. In Förster transfer, similar to a transmitter and an antenna, dipoles on the donor and acceptor molecules couple and energy may be transferred. Dipoles are generated from allowed transitions in both donor and acceptor molecules. This typically restricts the Forster mechanism to transfers between singlet states.

Nevertheless, as long as the phosphor can emit light due to some perturbation of the state such as due to spin-orbit coupling introduced by a heavy metal atom, it may participate as the donor in Förster transfer. The efficiency of the process is determined by the luminescent efficiency of the phosphor (F Wilkinson, in Advances in Photochemistry (eds. W. A. Noyes, G. Hammond, and J. N. Pitts), pp. 241–268, John Wiley & Sons, New York, 1964), i.e., if a radiative transition is more probable than a non-radiative decay, then energy transfer will be efficient. Such triplet-singlet transfers were predicted by Förster (T. Förster, "Transfer mechanisms of electronic excitation," Discussions of the Faraday Society, 1959, 27, 7–17) and confirmed by Ermolaev and Sveshnikova (V. L. Ermolaev and E. B. Sveshnikova, "Inductive-resonance transfer of energy from aromatic molecules in the triplet state," Doklady Akademii Nauk SSSR, 1963, 149, 1295–1298), who detected the energy transfer using a range of phosphorescent donors and fluorescent acceptors in rigid media at 77K or 90K. Large transfer distances are observed; for example, with triphenylamine as the donor and chrysoidine as the acceptor, the interaction range is 52 Å.

The remaining condition for Forster transfer is that the absorption spectrum should overlap the emission spectrum of the donor assuming the energy levels between the excited and ground state molecular pair are in resonance.

Devices whose structure is based upon the use of layers of organic optoelectronic materials generally rely on a common mechanism leading to optical emission. Typically, this mechanism is based upon the radiative recombination of a trapped charge. Specifically, OLEDs are comprised of at least two thin organic layers separating the anode and cathode of the device. The material of one of these layers is specifically chosen based on the material's ability to transport holes, a "hole transporting layer" (HTL), and the material of the other layer is specifically selected according to its ability to transport electrons, an "electron transporting layer" (ETL). With such a construction, the device can be viewed as a diode with a forward bias when the potential applied to the anode is higher than the potential applied to the cathode. Under these bias conditions, the anode injects holes (positive charge carriers) into the hole transporting layer, while the cathode injects electrons into the electron transporting layer. The portion of the luminescent medium adjacent to the anode thus forms a hole injecting and transporting zone while the portion of the luminescent medium adjacent to the cathode forms an electron injecting and transporting zone. The injected holes and electrons each migrate toward the oppositely charged electrode. When an electron and hole localize on the same molecule, a Frenkel exciton is formed. Recombination of this short-lived state may be visualized as an electron dropping from its conduction potential to a valence band, with relaxation occurring, under certain conditions, preferentially via a photoemissive mechanism. Under this view of the mechanism of operation of typical thin-layer organic devices, the electroluminescent layer comprises a luminescence zone receiving mobile charge carriers (electrons and holes) from each electrode. The OLEDs of the present invention include two electron transporting layers. The electron transporting layer adjacent to the hole transporting layer contains phosphorescent molecules doped therein.

As noted above, light emission from OLEDs is typically via fluorescence or phosphorescence. It has been noted that phosphorescent efficiency can decrease rapidly at high current densities. It may be that long phosphorescent lifetimes cause saturation of emissive sites, and triplet-triplet annihilation may also produce efficiency losses. Another difference between fluorescence and phosphorescence is that energy transfer of triplets from a conductive host to a luminescent guest molecule is typically slower than that of singlets; the long range dipole-dipole coupling (Föbrster transfer) which dominates energy transfer of singlets is (theoretically) forbidden for triplets by the principle of spin symmetry conservation. Thus, for triplets, energy transfer typically occurs by diffusion of excitons to neighboring molecules (Dexter transfer); significant overlap of donor and acceptor excitonic wavefunctions is critical to energy transfer. Another distinction between singlets and triplets is that triplet diffusion lengths are typically long (e.g., >1400 Å) compared with typical singlet diffusion lengths of about 200 Å. Thus, if phosphorescent devices are to achieve their potential, device structures need to be optimized for triplet properties. In the phosphorescent molecules having one formula $L_2MX$ or L L' L" M, the property of long triplet diffusion lengths may be exploited to improve external quantum efficiency.

Whenever a dopant is present in one of the organic layers, the predominant material in the charge carrier layer is referred to as a host compound. Materials that are present as host and dopant are selected so as to have a high level of energy transfer from the host to the dopant material. In addition, these materials need to be capable of producing acceptable electrical properties for the OLED. Furthermore, such host and dopant materials are preferably capable of being incorporated into the OLED using materials that can be readily incorporated into the OLED by using convenient fabrication techniques, in particular, by using vacuum-deposition techniques.

As found in the IrL$_3$ system described above, the emission color is strongly affected by the L ligand. This is consistent with the emission involving either MLCT or intraligand transitions. In all of the cases made in both the tris complex (i.e., IrL$_3$) and the L$_2$IrX complex, the emission spectra are very similar. For example Ir(ppy)$_3$ and (ppy)$_2$Ir(acac) (PPIr) give strong green emission with a $\lambda_{max}$ of 510 nm.

However, in other cases, the choice of X ligand affects both the energy of emission and efficiency. Acac and salicylanilide L$_2$IrX complexes give very similar spectra. The picolinic acid derivatives that have been prepared typically show a small blue shift (15 nm) in their emission spectra relative to the acac and salicylanilide complexes of the same ligands.

If an X ligand is used whose triplet levels fall lower in energy than the "L$_2$Ir" framework, emission from the X ligand can be observed. The phosphorescence spectra for heavy metal quinolates (e.g. IrQ$_3$ or PtQ$_2$) are centered at 650 nm. The complexes themselves emit with very low efficiency, <0.01. Both the energy and efficiency of the L$_2$IrQ material is consistent "X" based emission. If the emission from the X ligand or the "IrX" system were efficient this could have been a good red emitter. It is important to note that while all of the examples list here are strong "L" emitters, this does not preclude a good phosphor from being formed from "X" based emission.

Preferably, in the embodiments of the present invention having first and second electron transporting layers, the second electron transporting layer may be made of the electron transport material tris-(8-hydroxyquinoline) aluminum (Alq$_3$), which is used to transport electrons into the first electron transporting layer. Other suitable ETL materials that may be used as the second electron transporting layer can be found in U.S. Pat. No. 5,707,745, which, as indicated above, is incorporated in its entirety herein by reference. The Alq$_3$, which functions as an electron injection/electron transport layer has the following formula:

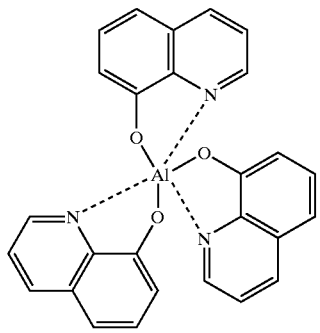

The second electron transporting layer is preferably from about 50 Å to about 200 Å thick.

Preferably, at least one of the hole transporting layer and the first and second electron transporting layers is vapor deposited. More preferably, each of these layers is vapor deposited. Other deposition techniques may be used and are known to those skilled in the art.

In the OLED structures of the present invention, light may be emitted from the substrate side of the device, or alternatively, from the side of the device opposite the substrate, that is, as a top emitting device.

The present invention also encompasses stacked OLED structures, in which at least one OLED or inverted OLED having a doped first ETL between an HTL and a second ETL, is stacked over a substrate. When more than one OLED is stacked over the substrate, the OLEDs are stacked one upon the other. An embodiment of a stacked OLED structure according to the present invention includes a substrate, a first organic light emitting device over the substrate, and a second organic light emitting device stacked over the first organic light emitting device. In another embodiment of the stacked OLED structure, a third organic light emitting device is stacked over the second organic light emitting device. In these structures at least one of the OLEDs has one of the following structures: 1) anode, hole transporting layer over the anode, first electron transporting layer (doped with a phosphorescent material) over the hole transporting layer, second electron transporting layer over the first electron transporting layer, and a cathode over the second electron transporting layer, or 2) a cathode, a first electron transporting layer over the cathode, a second electron transporting layer (doped with a phosphorescent material) over the first electron transporting layer, a hole transporting layer over the second electron transporting layer, and an anode over the hole transporting layer.

Also encompassed within the present invention are methods of fabricating organic light emitting device structures, which include depositing the layers of each OLED one over the other to form organic light emitting device structures. In embodiments having only one OLED over a substrate, one embodiment of the method includes forming a first electrically conductive (anode) layer over a substrate; depositing a first hole transporting layer over the first conductive layer; depositing a first electron transporting layer over the first hole transporting layer, wherein the first electron transporting layer is doped with a phosphorescent material; depositing a second electron transporting layer over the first electron transporting layer; and depositing a second electrically conductive (cathode) layer over the first electron transporting layer. Alternatively, in inverted OLED embodiments, the layers may be deposited starting with the second electrically conductive (cathode) layer and ending with the first electrically conductive (anode) layer.

Figure 2:
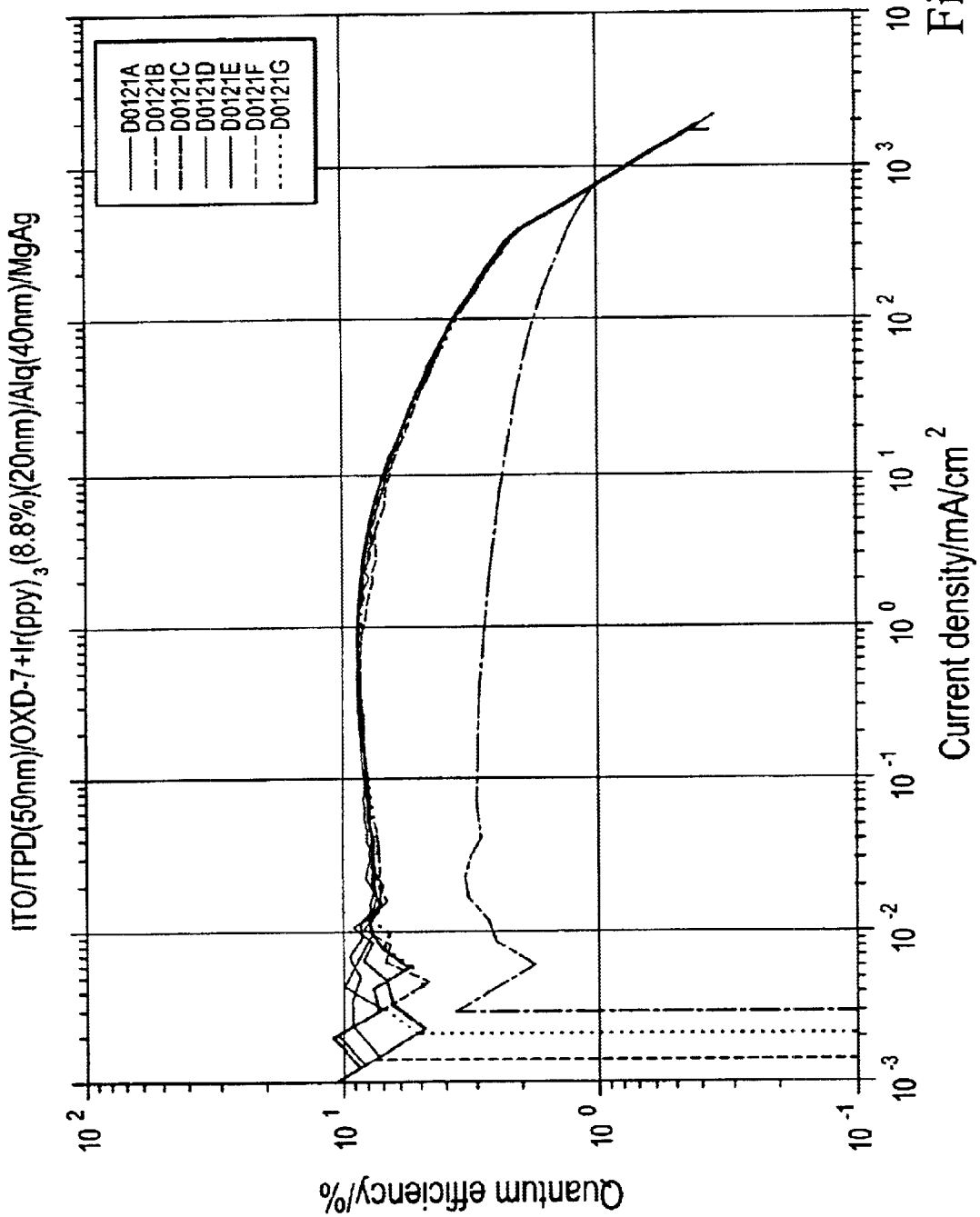
FIG. 2 is a graph showing the external quantum efficiency as a function of current density for an OLED having $Ir(ppy)_3$ doped in an oxadiazole (OXD-7) host material.

OLEDs fabricated in accordance with the above embodiment may contain for example, an ITO layer, a TPD layer thereover having a thickness of approximately 50 nm, an oxadiazole layer (OXD-7, as depicted above) doped, for example, with Ir(ppy)$_3$ (8.8%) having a thickness of approximately 20 nm, an Alq$_3$ layer thereover of approximately 40 nm thickness, and an MgAg layer thereover. A depiction of the EL intensity achievable by such an embodiment as a function of wavelength of this embodiment is depicted in FIG. 1. A depiction of the quantum efficiency as a function of current density is depicted in FIG. 2. The ITO coated substrate may be exposed to an ultra-violet/ozone treatment before deposition of the organic layers, with such a electrode/substrate layer being identified as an "ITO(UV)" electrode/substrate layer.

Substrates according to the present invention may be opaque or substantially transparent, rigid or flexible, and/or plastic, metal or glass. Although not limited to the thickness ranges recited herein, the substrate may be as thin as 10 $\mu$m if present as a flexible plastic or metal foil substrate, or substantially thicker if present as a rigid, transparent or opaque substrate, or if the substrate is made of silicon.

Suitable electrode (i.e., anode and cathode) materials include conductive materials such as a metal, a metal alloy or ITO which form electrical contacts. The deposition of electrical contacts may be accomplished by vapor deposition or other suitable metal deposition techniques. These electrical contacts may be made, for example, from indium, magnesium, platinum, gold, silver or combinations such as Ti/Pt/Au, Cr/Au or Mg/Ag.

When depositing the top electrode layer (i.e., the cathode or the anode, typically the cathode), that is, the electrode on the side of the OLED furthest from the substrate, damage to the organic layers should be avoided. For example, organic layers should not be heated above their glass transition temperature. Top electrodes are preferably deposited from a direction substantially perpendicular to the substrate.

In preferred embodiments, the cathode is preferably a low work function, electron-injecting material, such as a metal layer. Preferably, the cathode material has a work function that is less than about 4 electron volts. The cathode preferably is a metal layer of about 100 Å (angstroms) thick or less, and may be about 50 Å thick or less. The contacts are preferably made of magnesium silver or a magnesium and silver alloy. The metal cathode layer may be substantially thicker if the cathode layer is opaque.

The anode is preferably a high work function hole-injecting metal anode layer, for example, an indium tin oxide (ITO) layer. ITO is a transparent conductor which functions as an anode. ITO is a degenerate semiconductor formed by doping a wide band semiconductor. The carrier concentration of the ITO is in excess of $10^{19}/cm^3$. The ITO anode layer may be about 500 Å to greater than about 4000 Å thick.

In one preferred embodiment, the hole transporting layer is 4,4'-bis[N,N'-(3-tolyl)amino]-3,3'-dimethylbiphenyl (HMTPD). The hole transporting layer is preferably about 100 Å to about 800 Å thick, even more preferably about 200 Å to about 700 Å thick, and most preferably about 600 Å thick. Other examples of materials that may be suitable materials for the hole transporting layer can be found in U.S. Pat. No. 5,707,745, which is incorporated herein in its entirety by reference. Other materials suitable for use as a hole transporting layer may include, for example, 4,4'-bis [N-(1-naphthyl)-N-phenyl-amino]biphenyl ($\alpha$-NPD); N,N'-diphenyl-N,N'-bis(3-methylpheny)1-1'biphenyl-4,4'diamine (TPD); 4,4'-bis[N,N'-(3-tolyl)amino]-3,3'-dimethylbiphenyl (M14); and 4,4',4"-tris(30 methylphenylphenylamino) triphenylamine (MTDATA). Other suitable hole transporting materials are known in the art.

The present invention may also be used to fabricate transparent OLED structures. A device that is transparent is well suited for use in a heads-up display, for example on a windshield for a car, or a visor for a motorcycle or airplane helmet. Transparent OLED devices can also be stacked for multi-color products or to enhance intensity. In this embodiment, all layers should be transparent to visible light in a transparent OLED. A device that is transparent is also well suited for high contrast applications. High contrast is achieved by placing a background made of an optically absorbent material next to the display device. Light incident upon the device from external sources passes through the device and is absorbed by the background, reducing the reflection of light from external sources to the viewer.

It is desirable for the OLEDs of the present invention to be fabricated using materials that provide electroluminescent emission in a relatively narrow band centered near selected spectral regions, which correspond to one of the three primary colors, red, green and blue so that they may be used as a colored layer in an OLED or SOLED. It is also desirable that such compounds be capable of being readily deposited as a thin layer using vacuum deposition techniques so that they may be readily incorporated into an OLED that is prepared entirely from vacuum-deposited organic materials.

The OLEDs and OLED structures of the present invention optionally contain additional materials or layers depending on the desired effect, such as protective layers (to protect certain materials during the fabrication process), insulating layers, reflective layers to guide waves in certain directions, and protective caps, which cover the electrodes and organic layers in order to protect these layers from the environment. A description of insulating layers and protective caps is contained for example, in U.S. Pat. No. 6,013,538, which is hereby incorporated by reference.

There may be substantial variation of the type, number, thickness and order of the layers that are present, dependent on whether the device is a stacked OLED or a single OLED, whether an inverted sequence of OLED layers is present, whether the OLED is intended to produce emission in a preferred spectral region, or whether still other design variations are used.

This invention will now be described in detail with respect to showing how a certain specific representative embodiment thereof can be made, the materials, apparatus and process steps being understood as examples that are intended to be illustrative only. In particular, the invention is not intended to be limited to the methods, materials, conditions, process parameters, apparatus and the like specifically recited herein.

EXAMPLES OF THE INVENTION

Example 1

A hole transporting layer ("HTL") is first deposited onto the ITO (indium tin oxide) coated glass substrate. The HTL consists of 30 nm (300 Å) of NPD. A first electron transporting layer, which is also a blocking layer, consisting of TAZ, having a thickness of about 20 nm (200 Å) is deposited onto the HTL layer. The first electron transporting layer is doped with Ir(ppy)$_3$. A second electron transport layer of Alq$_3$ having a thickness of about 20 nm is deposited onto the first electron transporting layer. The device is finished by depositing a Mg—Ag electrode onto the second electron transporting layer. This Mg—Ag electrode has of thickness 100 nm. All of the depositions are carried out at a vacuum less than $5 \times 10^{-5}$ Torr. The devices are tested in air, without packaging.

When a voltage is applied between the cathode and the anode, holes are injected from ITO to NPD and transported by the NPD layer, while electrons are injected from MgAg to Alq$_3$ and transported through Alq$_3$. Then holes and electrons are injected into the first electron transporting layer and carrier recombination occurs in BCP, the excited states were formed, and the dopant molecules are excited and decay radiatively.

Example 2

Organic layers were deposited by high vacuum ($10^{-6}$ Torr) thermal evaporation onto a clean glass substrate pre-coated with an ITO layer. A 60 nm-thick film of 4,4'-bis[N, N'-(3-tolyl)amino]-3,3'-dimethylbiphenyl (HMTPD) serves as the HTL. Next a 25 nm-thick EML consisting of 6% to 8% Ir(ppy)$_3$ is doped into various electron transporting hosts via thermal co-deposition. A 50 nm-thick layer of the electron transport material tris-(8-hydroxyquinoline) aluminum (Alq$_3$) is used to transport and inject electrons into the EML. A shadow mask with 1 mm-diameter openings was used to define the cathode consisting of a 150 nm-thick magnesium silver (Mg—Ag) layer, with a 20 nm-thick Ag cap. Alternatively, the cathode consisted of a 100 nm-thick layer of aluminum-0.56wt % lithium.

Current density (J) versus voltage (V) measurements were obtained using a semiconductor parameter analyzer, with the luminance (L) obtained by placing the OLEDs directly onto the surface of a calibrated silicon photodiode. The photoluminescence lifetime was characterized using a streak camera following excitation by a nitrogen laser at a wavelength of 337 m and a pulse width of 500 ps.

Figure 3:
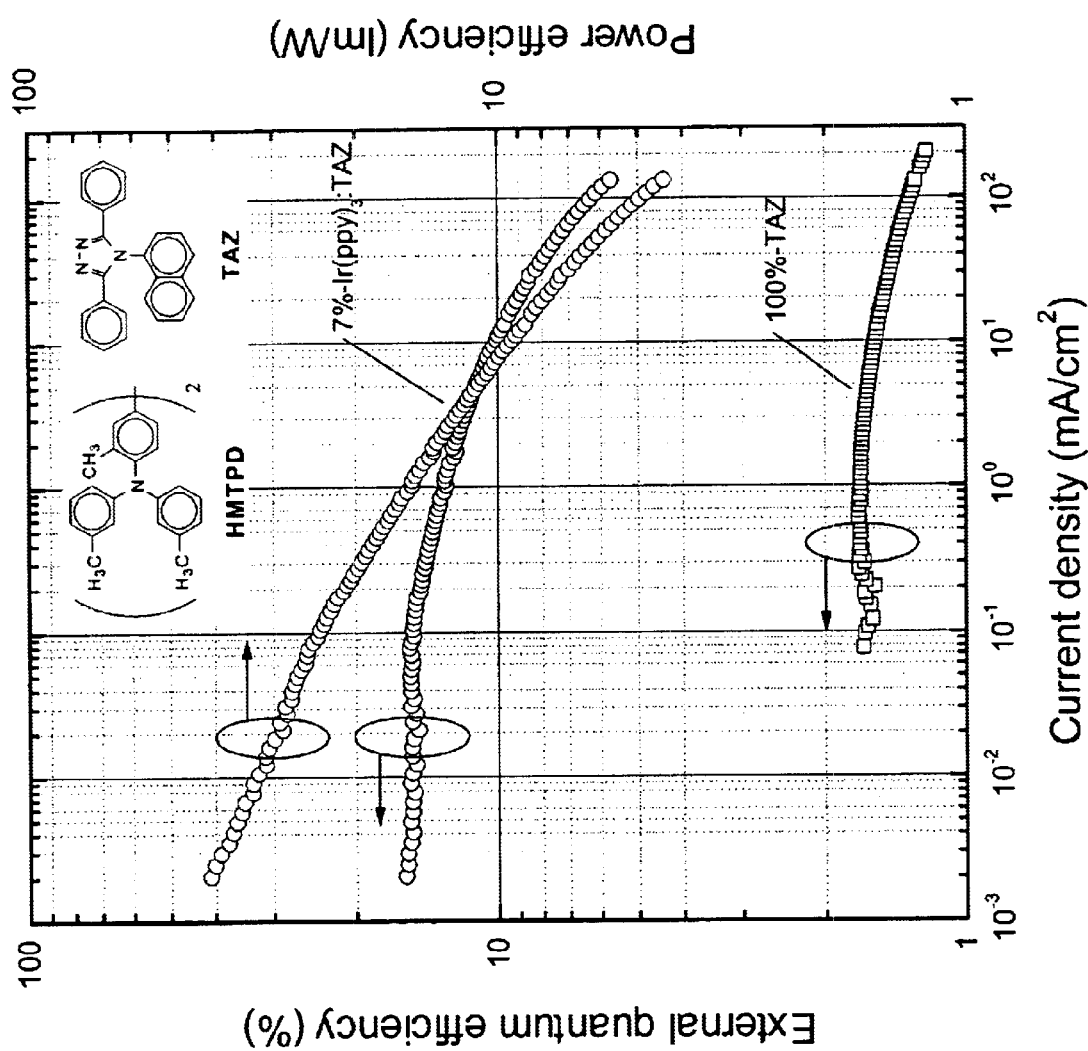
FIG. 3 shows the OLED external quantum efficiency ($\eta$) and power efficiencies of a 7% $Ir(ppy)_3$ doped TAZ device using an Al—Li cathode.

FIG. 3 shows the external quantum ($\eta$) and power efficiencies of a 7%-Ir(ppy)$_3$ doped TAZ device using an Al—Li cathode. A maximum $\eta$=15.4±0.2% and power efficiency of 40 lm/W were obtained, corresponding to an internal quantum efficiency of 77%. Furthermore, a high optical output power of P=2.5 mW/cm$^2$ (corresponding to a luminance of about 4000cd/m$^2$) with $\eta$=10% was maintained even at J=10 mA/cm$^2$. The device exhibits a very gradual decrease in quantum efficiency with increasing current characteristic of triplet-triplet annihilation effects observed in all electrophosphorescent devices. The value of $\eta$ is improved over known devices. At Ir(ppy)$_3$ concentrations less than 2%, a decrease to $\eta$ of about 3% was observed along with additional blue host emission (wavelength about 440 nm), while at high Ir(ppy)$_3$ concentrations, a significant decrease in $\eta$ was also observed due to the aggregate induced quenching.

In Table 1 below the performance of Ir(ppy)$_3$ doped OLEDs with various hosts and cathode metals is summarized.

TABLE 1

| Host | cathode | $\eta$(%) at J (mA/cm$^2$) | | | | photoluminescent decay time $\tau$(ns) |
|------|---------|------|------|------|------|------|
|      |         | 0.1  | 1    | 10   | 100  |      |
| TAZ  | AlLi    | 15.4 | 12.9 | 10.0 | 6.3  | about 650 |
|      | MgAg    | 12.3 | 11.9 | 9.7  | 5.8  | about 650 |
| OXD7 | MgAg    | 11.6 | 11.9 | 8.9  | 4.4  | about 650 |
| BCP  | MgAg    | 9.6  | 8.3  | 6.3  | 3.8  | about 380 |

Figure 4:
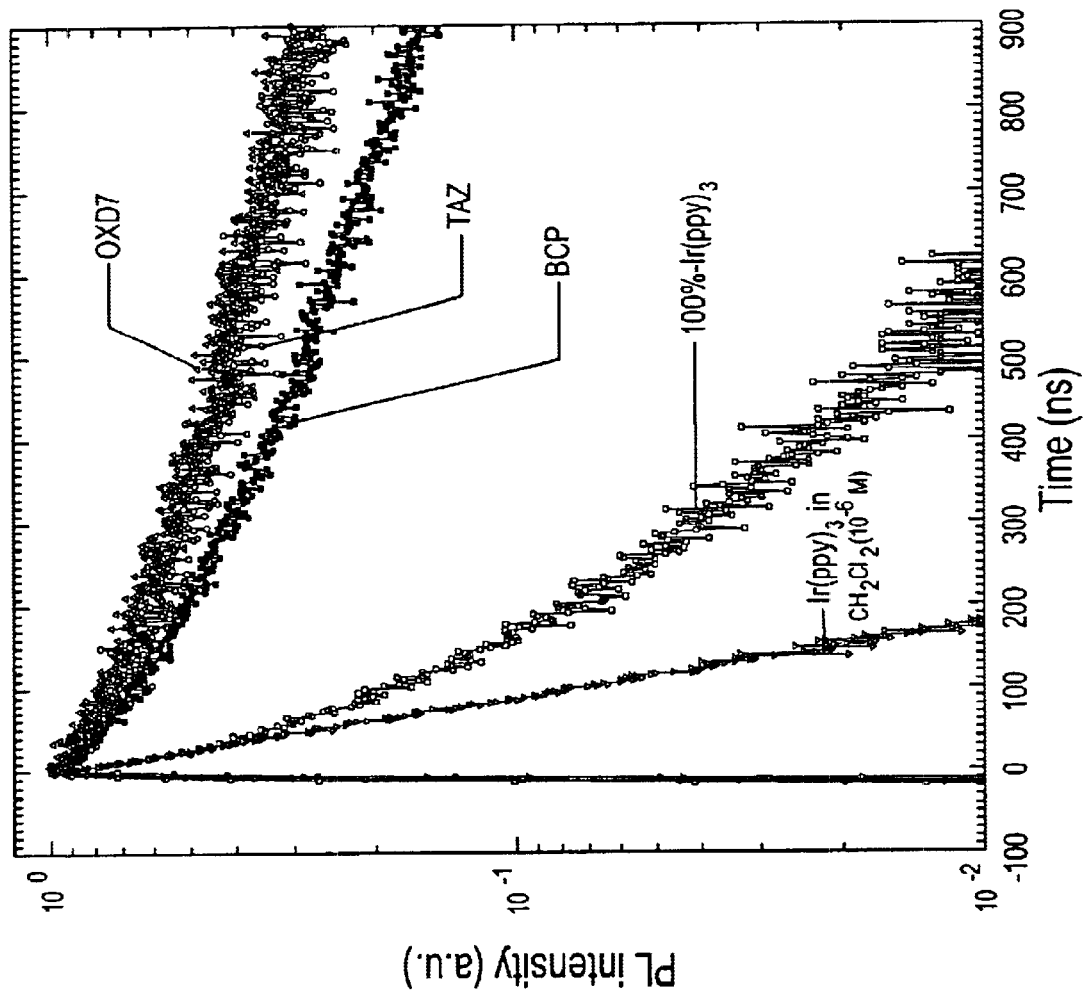
FIG. 4 shows the photoluminescent phosphorescent time decay of 7%-$Ir(ppy)_3$ in TAZ or OXD-7 as compared with 7%-$Ir(Ppy)_3$ in BCP; 100% $Ir(ppy)_3$; and $10^{-6}$M $Ir(ppy)_3$ in $CH_2Cl_2$.

As shown in FIG. 4, the transient phosphorescent time decay of Ir(ppy)$_3$ in TAZ or OXD-7 is about 650 ns, compared with a measured lifetime of about 380 ns in 7%-Ir(ppy)$_3$:BCP at room temperature. Since the phosphorescence efficiency is approximately proportional to the phosphorescent lifetime, the longer lifetime in TAZ and OXD7 accounts for the higher EL efficiencies of these devices.

In several experiments, the EML thickness was varied from 30 nm to 2.5 nm while maintaining both the HTL and ETL thicknesses at 50 nm and 40 nm, respectively. These devices were compared with a double heterostructure comprised of an EML sandwiched between HMTPD and a 10 nm thick ETL, as shown in the inset of FIG. 5.

Figure 5:
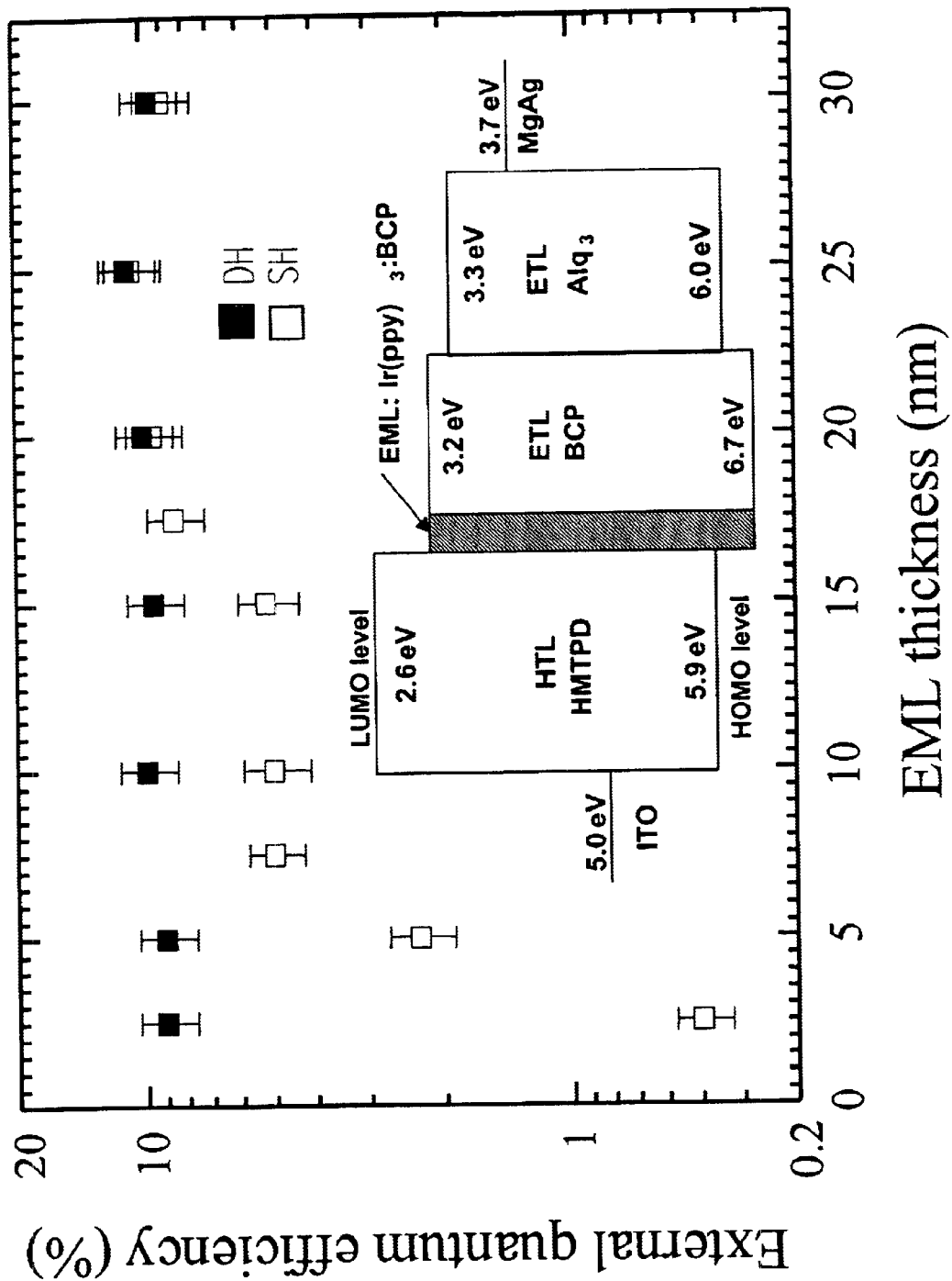
FIG. 5 shows the external quantum efficiency as a function of the EML thickness of a device according to the present invention.

FIG. 5 shows the thickness dependence of $\eta$ at a fixed current density of 0.1 mA/cm$^2$ for both single heterostructure and double heterostructure devices using BCP as a host. At an EML thickness of less than 15 nm, a significant decrease of $\eta$ was observed in the SH device, while a high $\eta$=9% was retained even with a 2.5 nm-thick EML in the DH device. This suggests the successful confinement of both charge carriers and triplet excitons within the thin EML.

Figure 6:
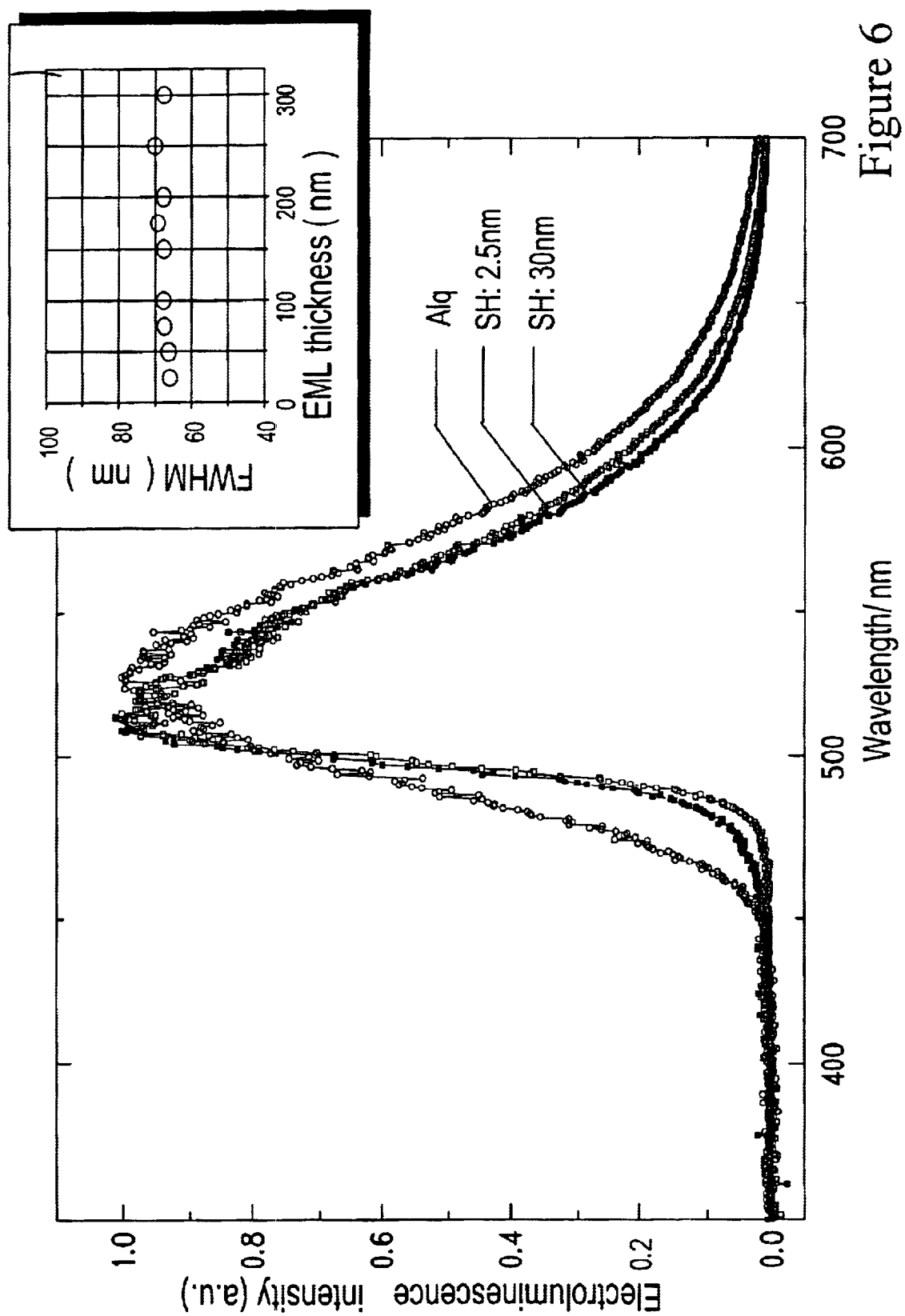
FIG. 6 shows the EL spectra of two single heterostructure devices with an EML thickness of 2.5 nm and 30 nm and that of an $ITO/HMTPD/Alq_3/MgAg$ device.

In FIG. 6, the EL spectra of two SH devices with an EML thickness of 2.5 nm and 30 nm are shown, as well as that of an ITO/HMTPD/Alq$_3$/MgAg device. Also, the dependence of the full width at half maximum (FWHM) of the EL spectra on the EML thickness in the SH devices, is plotted. It is believed from FIG. 6 that the exciton formation occurs entirely in the EML, followed by direct charge trapping by Ir(ppy)$_3$. Since BCP serves as both an electron transporting and hole blocking material, holes are directly injected from the HTL into the Ir(ppy)$_3$ highest occupied molecular orbital level, and subsequently recombine with electrons which are transported across the BCP layer, leading to triplet formation in the Ir(ppy)$_3$.

External EL efficiencies of electrophosphorescent devices as high as 15.4%, corresponding to an internal efficiency approaching 80% may be achieved by the present invention. Furthermore, luminance efficiency of 40 lm/W may be obtained using 7% Ir(ppy)$_3$:TAZ.

Figure 7:
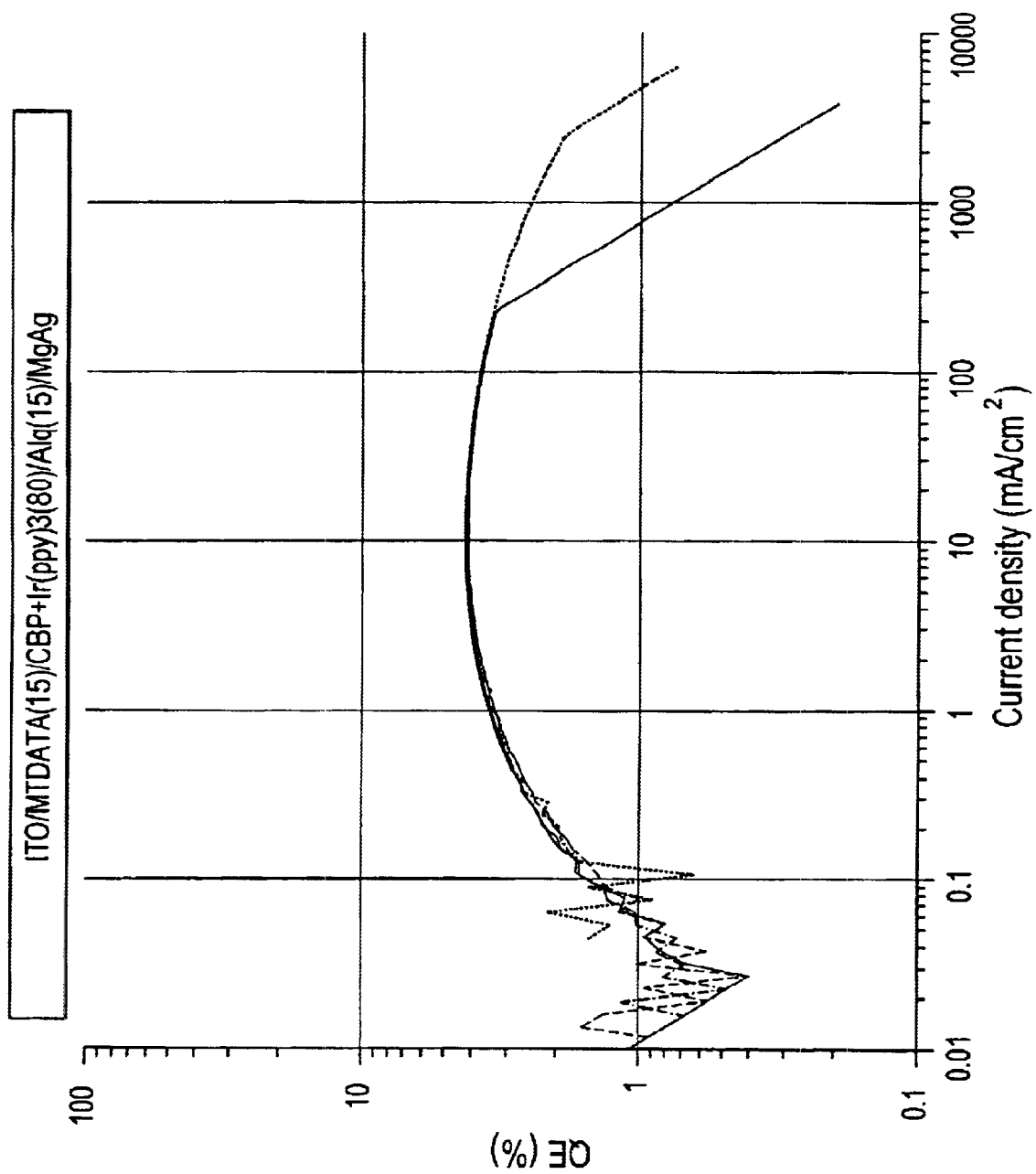
FIG. 7 is a graph showing the external quantum efficiency as a function of current density for an OLED having $Ir(ppy)_3$ doped in a 4,4'-N,N'-dicarbazole-biphenyl (CBP) host material.
Figure 8:
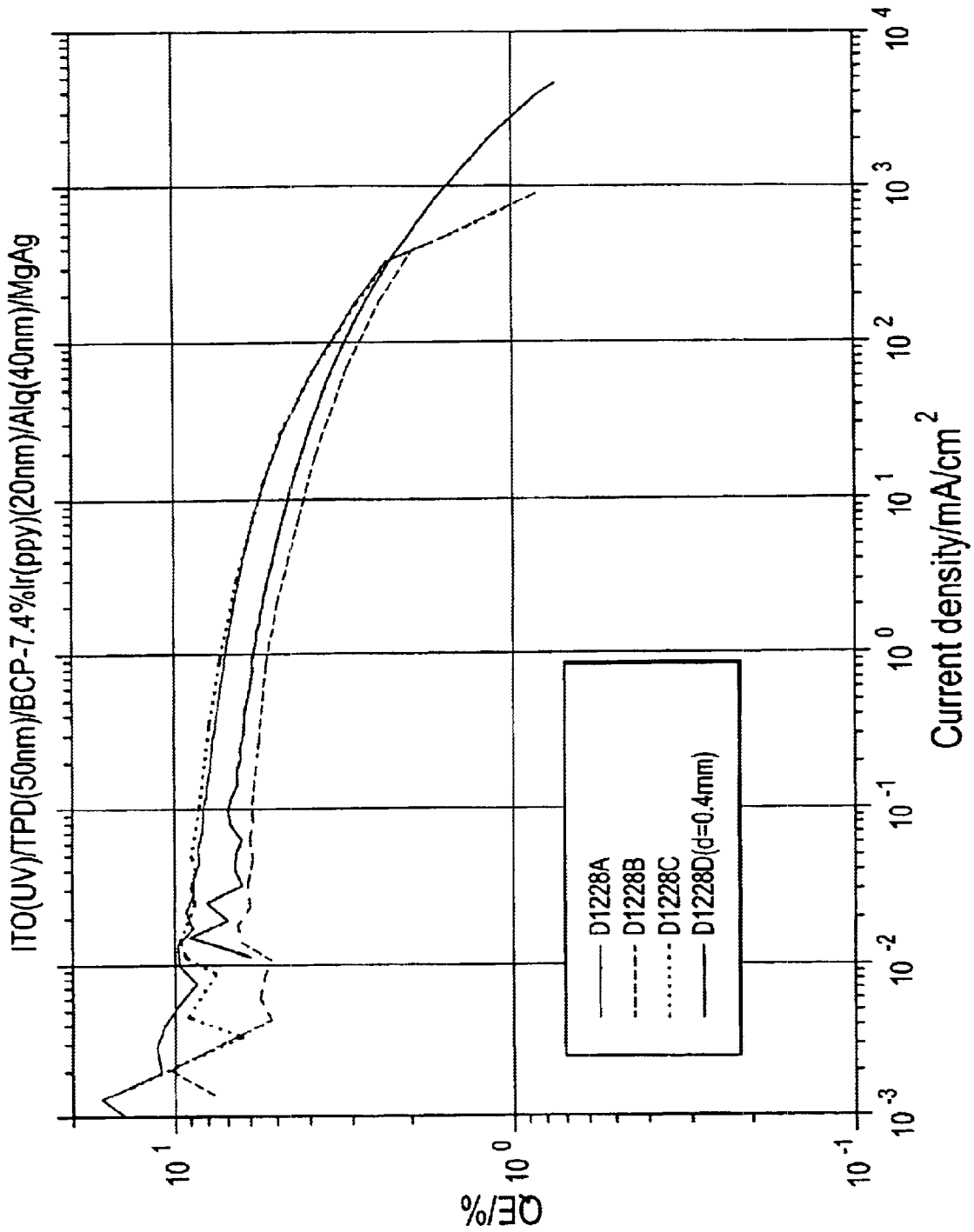
FIG. 8 is a graph showing the external quantum efficiency as a function of current density for an OLED having $Ir(ppy)_3$ doped in a phenanthroline (BCP) host material.
Figure 9:
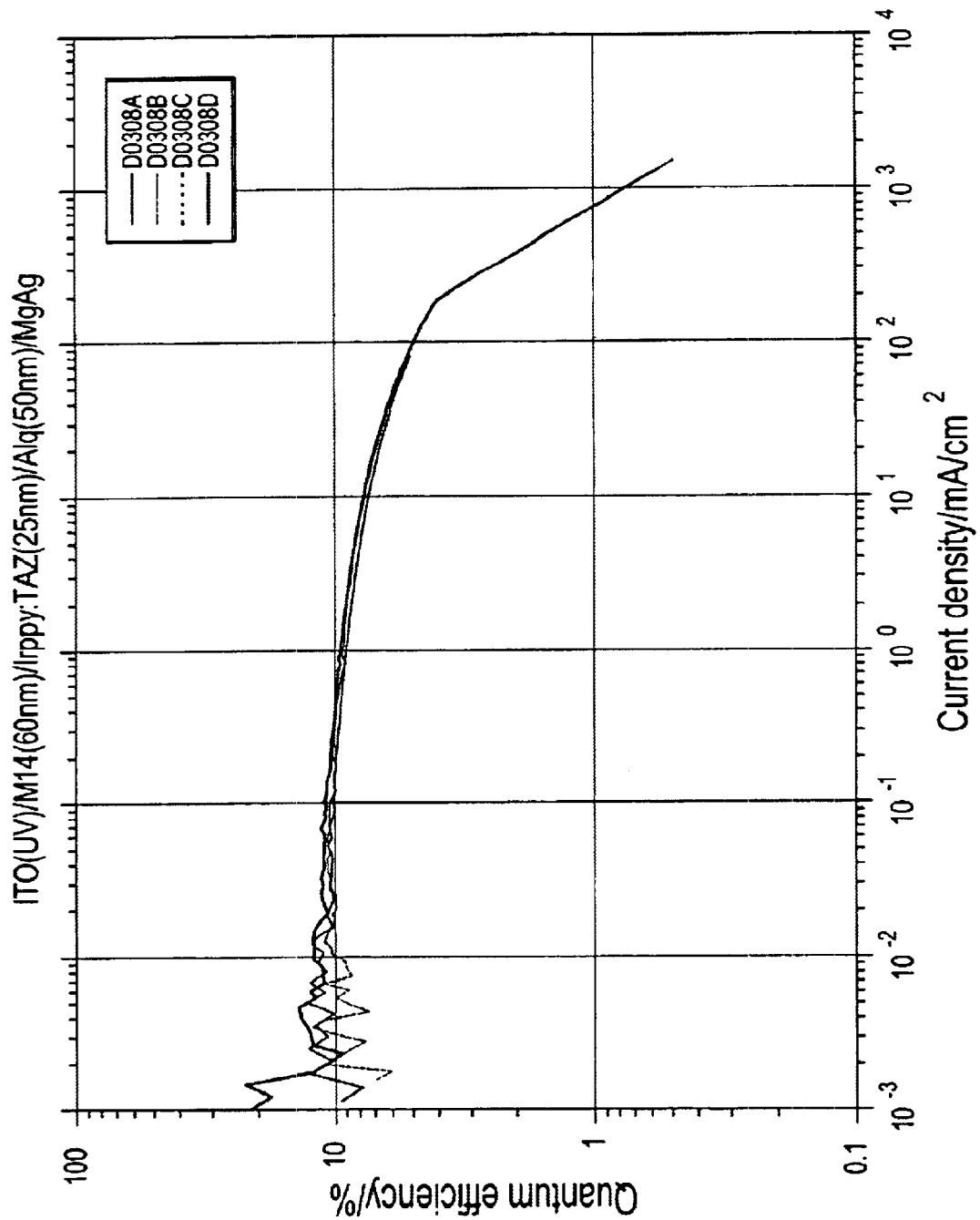
FIG. 9 is a graph showing the external quantum efficiency as a function of current density for an OLED having $Ir(ppy)_3$ doped in a triazole (TAZ) host material.
Figure 10:
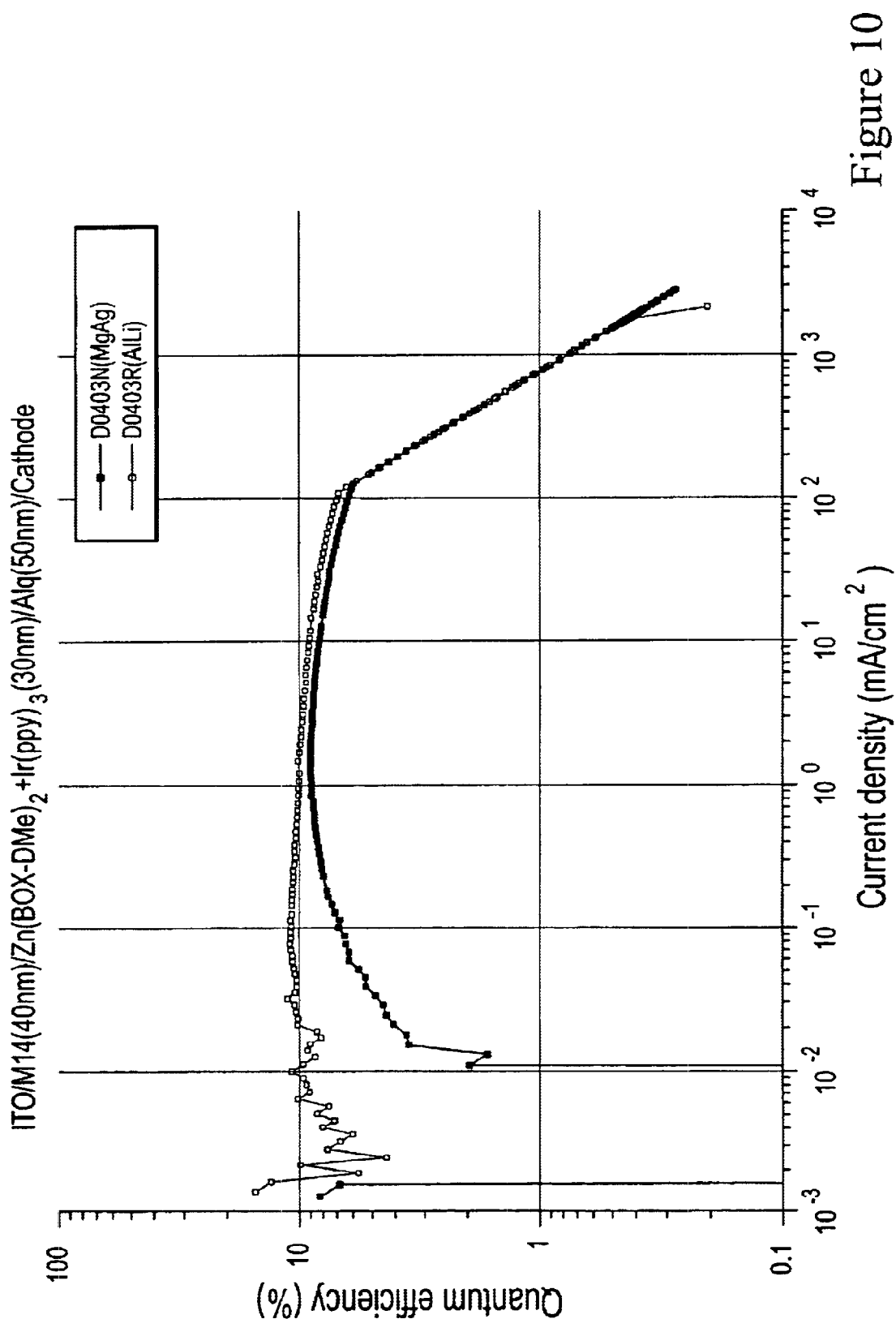
FIG. 10 is a graph showing the external quantum efficiency as a function of current density for an OLED having $Ir(ppy)_3$ doped in a zinc benzoxazole ($Zn(BOX-DMe_2)$) host material.

The external quantum efficiencies are also shown as a function of current density for an OLED having Ir(ppy)$_3$ doped in a phenanthroline (BCP) host material, FIG. 8; doped in a triazole (TAZ) host material, FIG. 9; doped in a zinc benzoxazole (Zn(BOX-DMe$_2$) host material, FIG. 10; and doped in a 4,4'-N,N'-dicarbazole-biphenyl (CBP) host material, FIG. 7.

Devices that include the benzoxazole (Zn(BOX-DMe$_2$) and 4,4'-N, N'-dicarbazole-biphenyl (CBP) compounds may be fabricated using similar fabrication methods.

The structures of the present invention may be used for example, in substantially any type of device that includes one or more OLEDs including billboards and signs, computer monitors, vehicles, telecommunications devices, telephones, printers televisions, large area wall screens, theater screens and stadium screens.

While the present invention is described with respect to particular examples and preferred embodiments, it is understood that the present invention is not limited to these examples and embodiments. In particular, the present invention may be applied to a wide variety of electronic devices. The present invention as claimed therefore includes variations from the particular examples and preferred embodiments described herein, as will be apparent to one of skill in the art.

What is claimed is:

1. An organic light emitting device comprising an anode, a cathode and an emissive layer, wherein the emissive layer is located between the anode and the cathode and the emissive layer comprises an electron transporting host material doped with a phosphorescent dopant material, wherein the phosphorescent dopant material has a HOMO energy less than the ionization potential of the electron transporting host material.

2. The organic light emitting device of claim 1, wherein the phosphorescent dopant material has a LUMO energy level lower than a LUMO energy level of the electron transporting host material.

3. The organic light emitting device of claim 1, wherein the electron transporting host material comprises an aryl-substituted oxadiazole.

4. The organic light emitting device of claim 3, wherein the aryl-substituted oxadiazole comprises a compound represented by

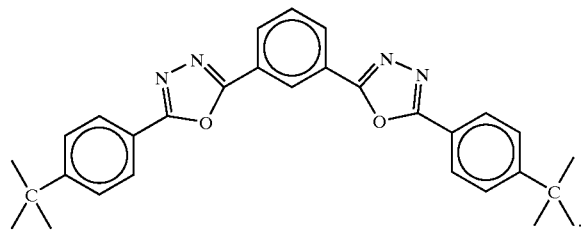

5. The organic light emitting device of claim 1, wherein the electron transporting host material comprises an aryl-substituted triazole.

6. The organic light emitting device of claim 5, wherein the aryl-substituted triazole comprises 3-phenyl-4-(1'-naphthyl)-5-phenyl-1,2,4-triazole.

7. The organic light emitting device of claim 1, wherein the electron transporting host material comprises an aryl-substituted phenanthroline.

8. The organic light emitting device of claim 7, wherein the aryl-substituted phenanthroline comprises 2,9-dimethyl-4,7-diphenyl-1,10-phenanthroline.

9. The organic light emitting device of claim 1, wherein the electron transporting host material comprises a benzoxazole or benzothiazole compound having the chemical structure:

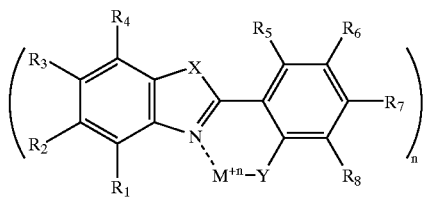

where X and Y are independently O, S;
M represents a metal;
n is a integer from 1 to 3; and
$R_1$ to $R_8$ are, independently, a hydrogen atom, an aryl group or an alkyl group.

10. The organic light emitting device of claim 1, wherein the electron transporting material comprises a zinc benzoxazole compound having the chemical structure:

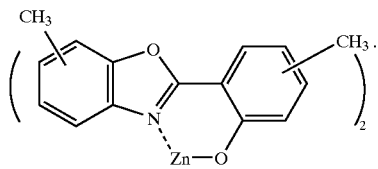

11. The organic light emitting device of claim 1, wherein the phosphorescent dopant material comprises fac-tris (2-phenylpyridine)-iridium.

12. An organic light emitting device comprising:
a substrate;
an anode layer over said substrate;
a hole transporting layer over said anode layer;
a first electron transporting layer over said hole transporting layer, wherein said first electron transporting layer comprises an electron transporting host material doped with a phosphorescent dopant material, wherein the phosphorescent dopant material has a HOMO energy less than the ionization potential of the electron transporting host material;
a second electron transporting layer over said first electron transporting layer; and
a cathode layer over said second electron transporting layer.

13. The organic light emitting device of claim 12, wherein the phosphorescent dopant material has a LUMO energy level lower than a LUMO energy level of the electron transporting host material.

14. The organic light emitting device of claim 12, wherein the electron transporting host material comprises an aryl-substituted oxadiazole.

15. The organic light emitting device of claim 14, wherein the aryl-substituted oxadiazole comprises a compound represented by

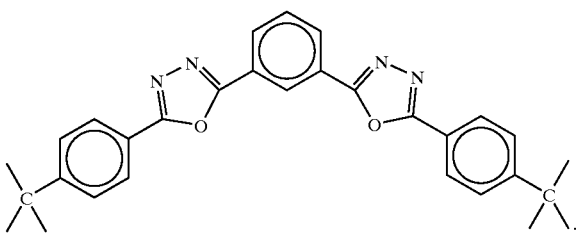

16. The organic light emitting device of claim 12, wherein the electron transporting host material comprises an aryl-substituted triazole.

17. The organic light emitting device of claim 16, wherein the aryl-substituted triazole comprises 3-phenyl-4-(1'-naphthyl)-5-phenyl-1,2,4-triazole.

18. The organic light emitting device of claim 12, wherein the electron transporting host material comprises an aryl-substituted phenanthroline.

19. The organic light emitting device of claim 18, wherein the aryl-substituted phenanthroline comprises 2,9-dimethyl-4,7-diphenyl-1,10-phenanthroline.

20. The organic light emitting device of claim 12, wherein the electron transporting host material comprises a benzoxazole or benzothiazole compound having the chemical structure:

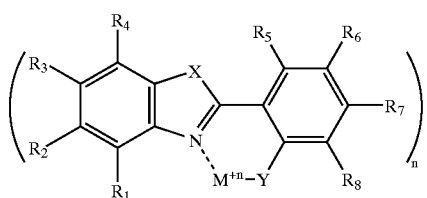

where X and Y are independently O, S;
M represents a metal;
n is a integer from 1 to 3; and
$R_1$ to $R_8$ are, independently, a hydrogen atom, an aryl group or an alkyl group.

21. The organic light emitting device of claim 12, wherein the electron transporting material comprises a zinc benzoxazole compound having the chemical structure:

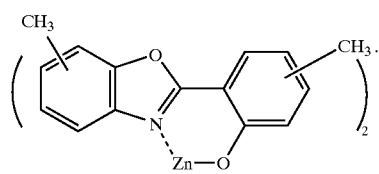

22. The organic light emitting device of claim 12, wherein the phosphorescent dopant material comprises fac-tris (2-phenylpyridine)-iridium.

* * * * *

UNITED STATES PATENT AND TRADEMARK OFFICE
CERTIFICATE OF CORRECTION

| | | |
|---|---|---|
| PATENT NO. | : 6,645,645 B1 | Page 1 of 1 |
| APPLICATION NO. | : 09/629335 | |
| DATED | : November 11, 2003 | |
| INVENTOR(S) | : Forrest et al. | |

It is certified that error appears in the above-identified patent and that said Letters Patent is hereby corrected as shown below:

Column 1, line 3 (after the title) please insert the following paragraph:

GOVERNMENT RIGHTS
This invention was made with Government support under Contract No. F33615-94-1-1414 awarded by DARPA. The government has certain rights in this invention.

Signed and Sealed this

Seventeenth Day of July, 2007

JON W. DUDAS
*Director of the United States Patent and Trademark Office*